(12) United States Patent
Sakai et al.

(10) Patent No.: US 7,568,610 B2
(45) Date of Patent: Aug. 4, 2009

(54) METHOD OF SOLDERING ELECTRONIC COMPONENT HAVING SOLDER BUMPS TO SUBSTRATE

(75) Inventors: Tadahiko Sakai, Fukuoka (JP); Tadashi Maeda, Fukuoka (JP)

(73) Assignee: Panasonic Corporation, Osaka (JP)

( * ) Notice: Subject to any disclaimer, the term of this patent is extended or adjusted under 35 U.S.C. 154(b) by 386 days.

(21) Appl. No.: 11/157,921

(22) Filed: Jun. 22, 2005

(65) Prior Publication Data

US 2005/0284921 A1    Dec. 29, 2005

(30) Foreign Application Priority Data

Jun. 24, 2004  (JP)  ............... 2004-186092
Nov. 4, 2004   (JP)  ............... 2004-320233

(51) Int. Cl.
*B23K 31/02* (2006.01)
*B23K 31/00* (2006.01)

(52) U.S. Cl. ............... 228/180.22; 228/180.1; 228/180.21

(58) Field of Classification Search .................. None
See application file for complete search history.

(56) References Cited

U.S. PATENT DOCUMENTS

| 5,439,162 | A  |   | 8/1995  | George et al. |
| 6,189,771 | B1 | * | 2/2001  | Maeda et al. ............ 228/248.1 |
| 6,209,196 | B1 |   | 4/2001  | Ozono et al. |
| 6,460,755 | B1 |   | 10/2002 | Inoue et al. |
| 6,951,666 | B2 | * | 10/2005 | Kodas et al. ............ 427/376.6 |

| 2002/0033275 | A1 | * | 3/2002  | Sumi et al. .................. 174/262 |
| 2002/0185309 | A1 |   | 12/2002 | Imamura et al. |
| 2003/0066681 | A1 |   | 4/2003  | Uchida et al. |

FOREIGN PATENT DOCUMENTS

| JP | 11-145192   |   | 5/1999 |
| JP | 2000-031210 |   | 1/2000 |
| JP | 2000-114301 |   | 4/2000 |
| JP | 2000-228575 | A | 8/2000 |
| JP | 2002-224884 | A | 8/2002 |
| JP | 2003-117681 |   | 4/2003 |

OTHER PUBLICATIONS

Bhushan, Bharat. Contact mechanics of rough surfaces in tribology: multiple asperity contact, 1998, Tribology Letters, 4, pp. 1-35.*

* cited by examiner

*Primary Examiner*—Jerry Lorengo
*Assistant Examiner*—Kevin M Johnson
(74) *Attorney, Agent, or Firm*—McDermott Will & Emery LLP

(57) ABSTRACT

A method of soldering electronic component (6) having solder bumps (7) formed thereon to substrate (12), wherein bumps (7) are pressed against a flux transferring stage on which a thin film is formed of flux (10) containing metal powder (16) of good wettability to solder so as to cause metal powder (16) to penetrate oxide films (7a) and embed in the surfaces on the bottom parts of bumps (7), and bumps (7) in this state are positioned and mounted to electrodes (12a) on substrate (12). Substrate (12) is then heated to melt bumps (7) and allow the melted solder to flow and spread along the surfaces of metal powder (16) toward electrodes (12a). The method can thus provide solder bonding portions of high quality without any soldering defect and deterioration of the insulating property.

7 Claims, 6 Drawing Sheets

FIG. 7

METHOD OF SOLDERING ELECTRONIC COMPONENT HAVING SOLDER BUMPS TO SUBSTRATE

TECHNICAL FIELD

The present invention relates to a soldering method for soldering an electronic component having solder bumps to a substrate.

BACKGROUND ART

Soldering method is widely used as the means of bonding when electronic components are mounted to a substrate. It is known as one such means of conventional soldering that metal bumps are formed with solder on electronic components to serve as bonding electrodes. Because of miniaturization in size of the bumps for solder bonding due to the advancement of downsizing and compact mounting of electronic components in recent years, it is not avoidable for the bumps to vary in size even among those formed on one and the same electronic component. It is therefore very likely that, if any of the bumps is smaller in size than the other bumps, a gap is left between that bump and a circuit electrode on a substrate when the electronic component is placed on the substrate.

When the bumps are heated for soldering with the gap left open in this manner, the melted solder bumps in a liquid state may cool down and solidify before all the bumps come into contact to surfaces of the circuit electrodes, thereby causing incomplete bonding of the solder. There is a solder bonding method known to prevent such soldering defect, in which the solder bonding portion is supplied with a metallic paste containing metal powder such as silver whose melting point is higher than that of the solder which composes the bumps, when making solder bonding with the bumps. Such method of the solder bonding is disclosed in Japanese Patent Unexamined Publication, No. 2000-114301, for example.

According to this method, melted solder of the bumps flows and spreads over surfaces of the metal powder that remains solid at the moment the bumps melt in the heating process, so that the melted solder is brought to the surface of the circuit electrode even when there is a gap as discussed above, thereby providing an advantage of preventing the soldering defect attributable to the gap between the bump and the circuit electrode.

In the conventional soldering method discussed above, however, the metallic paste needs to contain an active agent to remove oxide films on the surfaces of the solder bumps and to ensure wettability of the bumps in order to allow the melted solder of the bumps to flow through metal powder. There is a case however, that the following problem occurs when flux of a strong activating effect is used.

In recent years, no-cleaning method has become the mainstream in the light of environmental protection and simplification of the working process, which method omits a cleaning process for removing and cleansing flux used for soldering, or the work that has been done previously with a cleansing agent after the solder bonding process. In this no-cleaning method, the flux supplied during the soldering remains intact on the solder bonding portions. If the flux left in this process is very active, it tends to promote deterioration of the insulating property attributable to corrosion of the circuit electrodes on the substrate caused by the residual flux. As described, the conventional soldering method has the problem of causing such troubles as soldering defect and deterioration of the insulating property.

DISCLOSURE OF INVENTION

The present invention relates to a soldering method for soldering an electronic component formed with solder bumps to electrodes on a substrate, and the method comprises the steps of spreading flux containing metal powder into a membranous form on a stage having a smooth plane; pressing the solder bumps against a portion of the smooth plane covered with the flux of the membranous form to make the metal powder into embedment in surfaces of the solder bumps; disposing the solder bumps embedded with the metal powder on the substrate while aligning them with the electrodes; and heating the substrate to melt the solder bumps and leading the melted solder to the electrodes on the substrate by flowing and spreading the melted solder along surfaces of the metal powder.

According to the present invention, the solder bumps embedded with the metal powder are disposed on the substrate in alignment with the electrodes, and the solder bumps melted by heating the substrate is flowed and spread to the electrodes on the substrate through the surfaces of the metal powder embedded in the solder bumps, and thereby the invention can provide solder bonding portions of high quality without causing soldering defect and deterioration of insulating property.

BEST MODE FOR CARRYING OUT THE INVENTION

Description is provided hereinafter of exemplary embodiments of the present invention with reference to the accompanying drawings.

First Exemplary Embodiment

Figure 1:
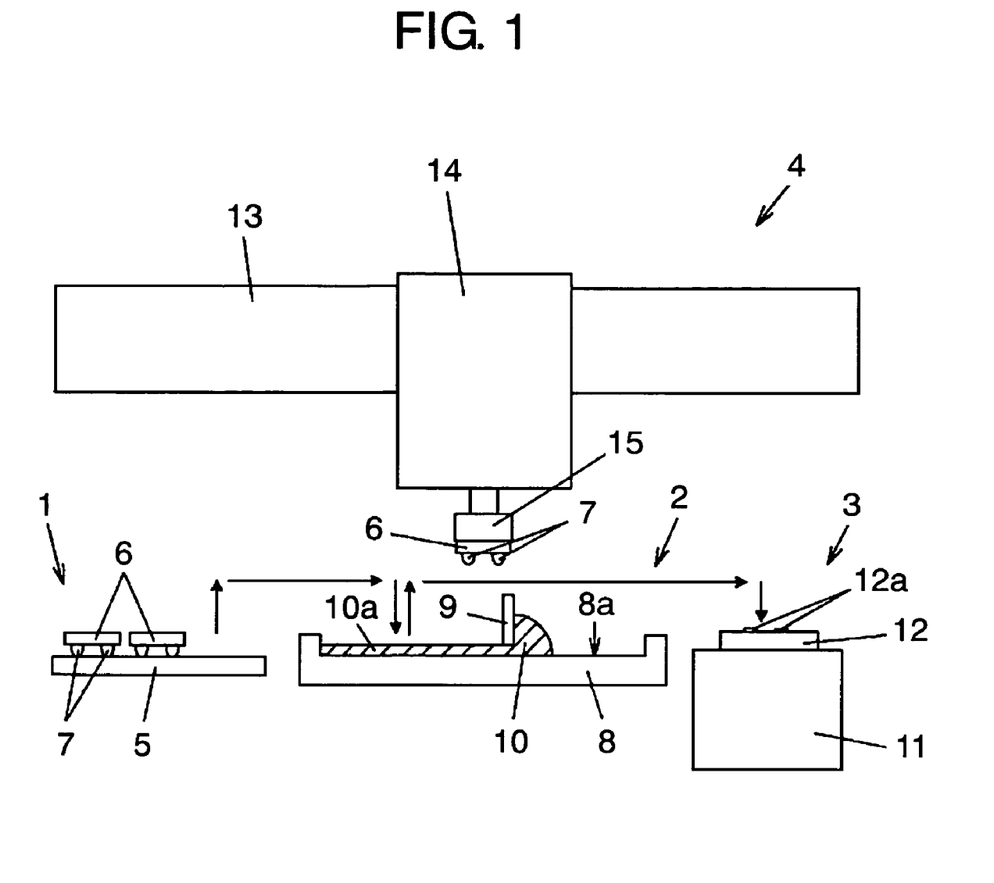
FIG. 1 is a front view of an electronic component mounting apparatus adapted for a soldering method according to a first exemplary embodiment of this invention.
Figure 2A:
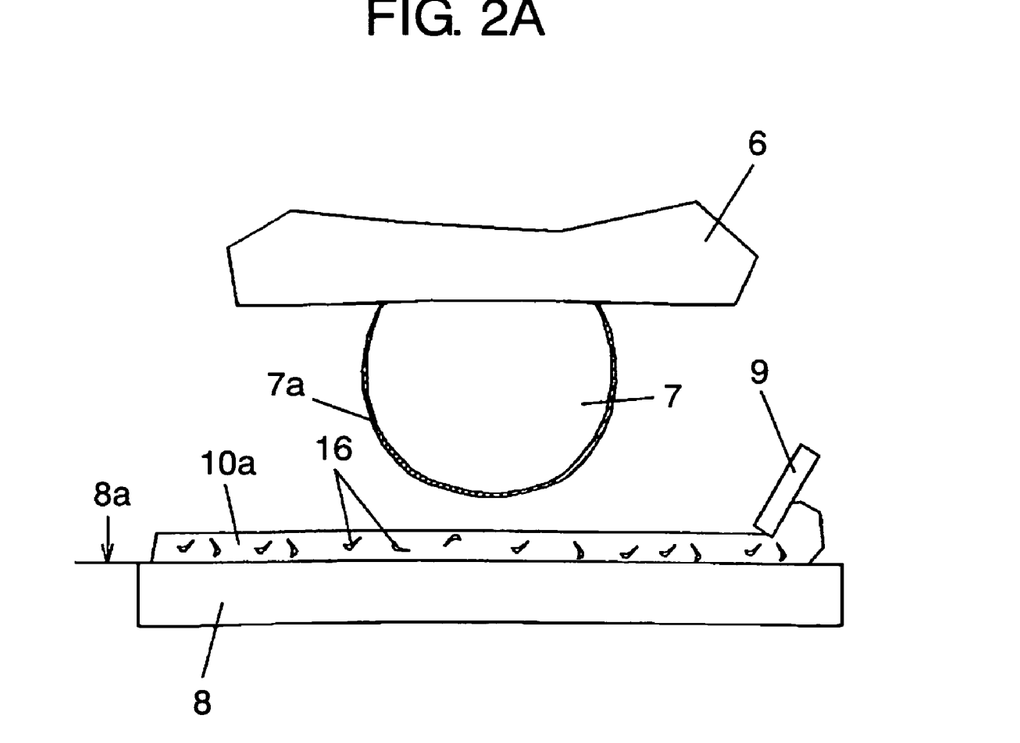
FIG. 2A and FIG. 2B are explanatory drawings showing the soldering method according to the first exemplary embodiment of this invention.
Figure 2B:
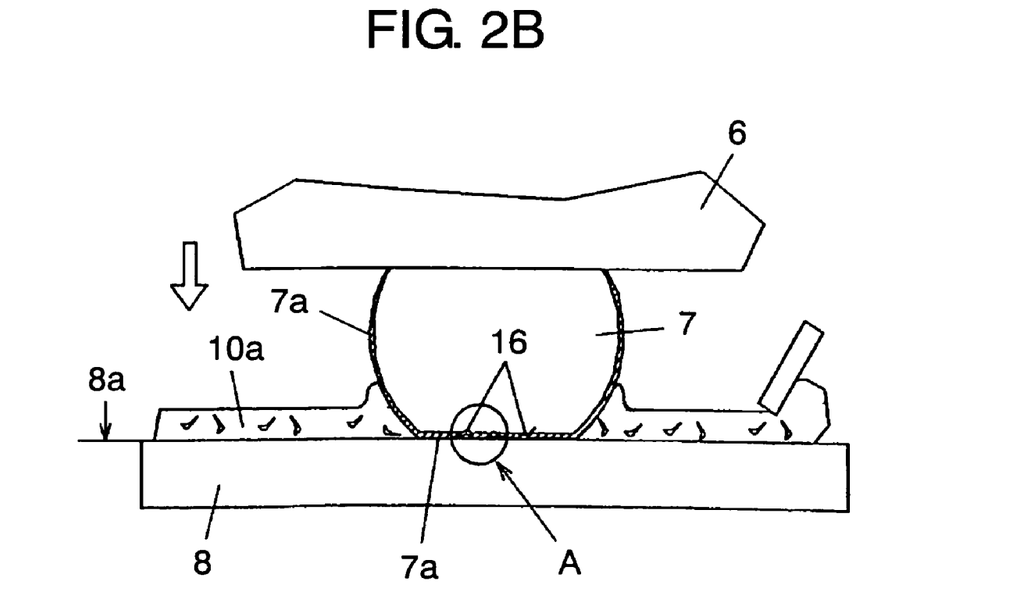
Figure 3A:
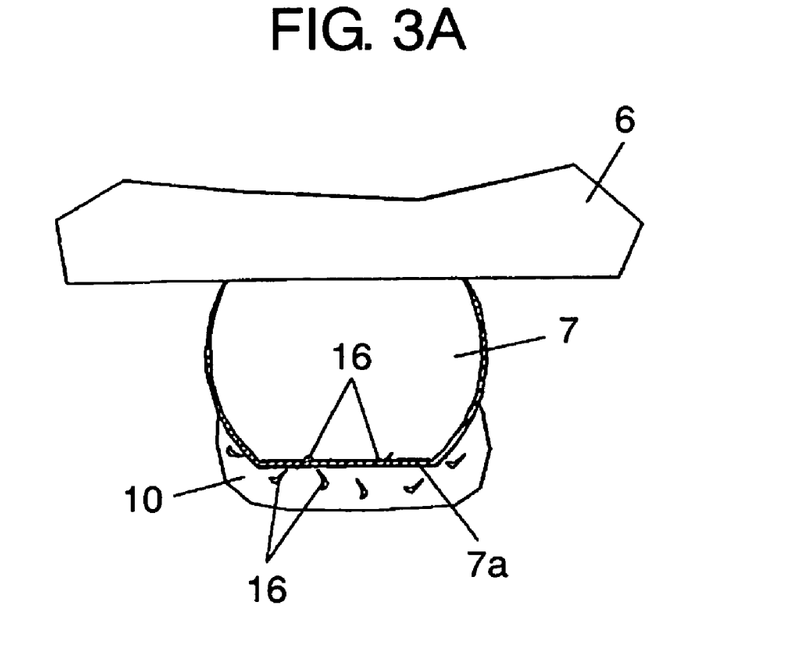
FIG. 3A and FIG. 3B are explanatory drawings also showing the soldering method according to the same exemplary embodiment.
Figure 3B:
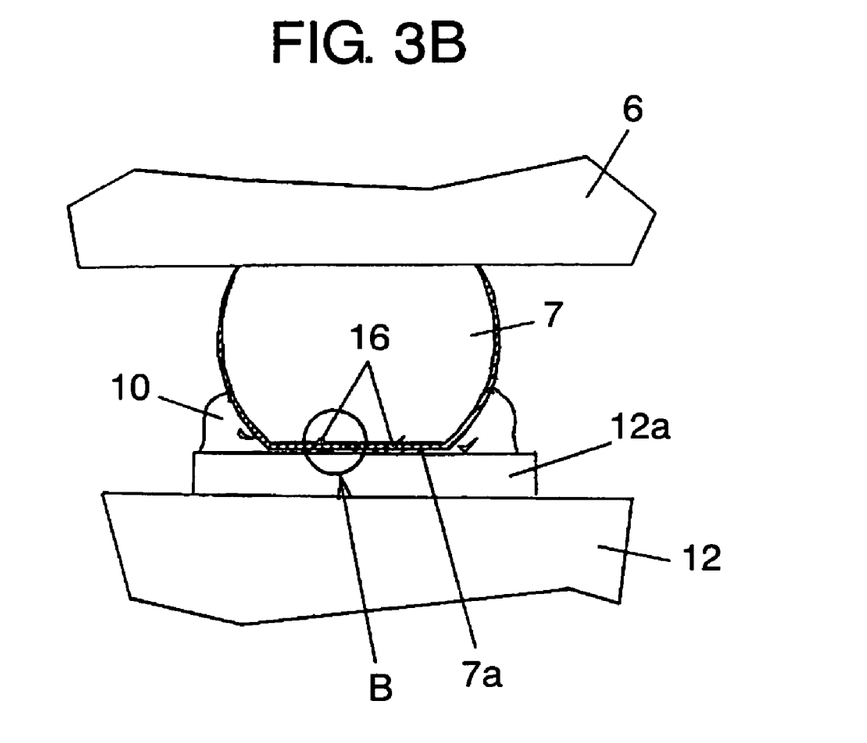
Figure 4:
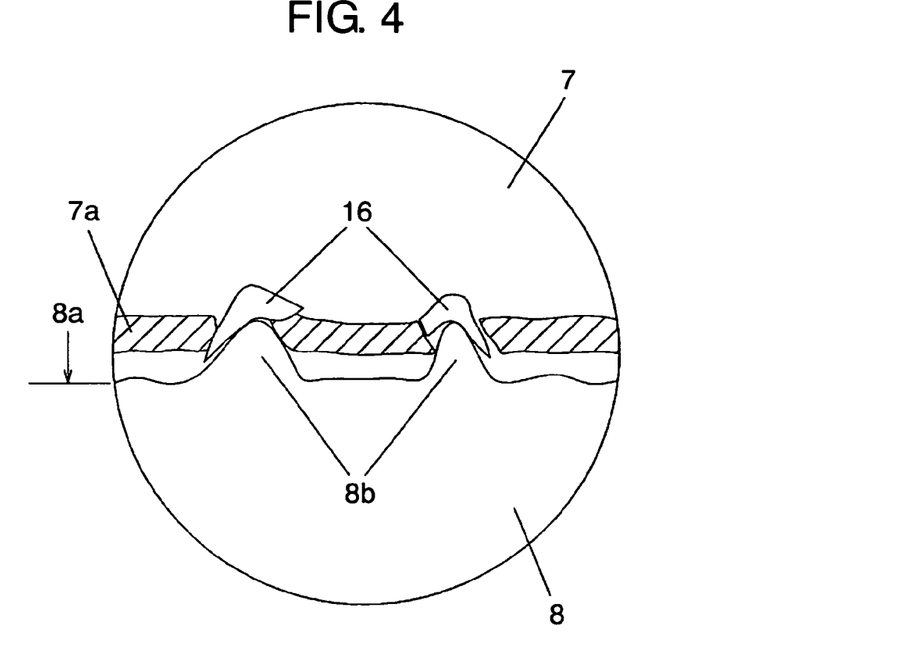
FIG. 4 is an explanatory drawing showing a flux transferring process in the same soldering method.
Figure 5:
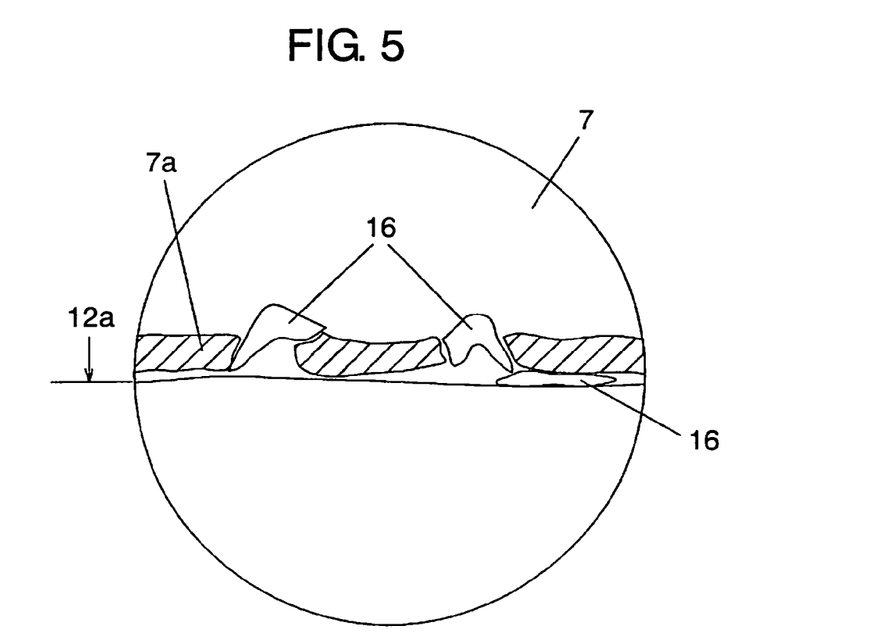
FIG. 5 is an explanatory drawing showing a solder bonding process in the same soldering method.
Figure 6A:
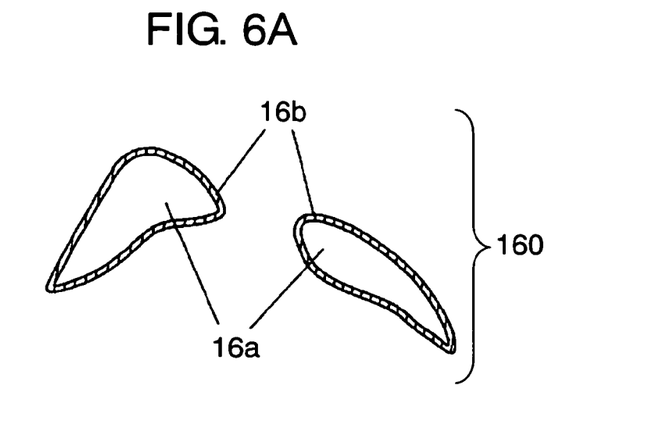
FIG. 6A, FIG. 6B and FIG. 6C are sectioned views of metal powder mixed with flux according to the same soldering method.
Figure 6B:
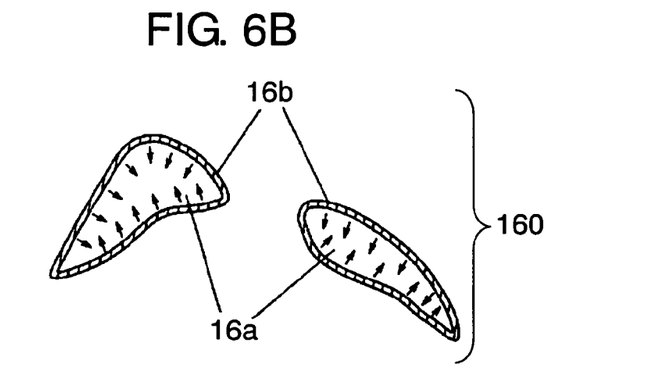
Figure 6C:
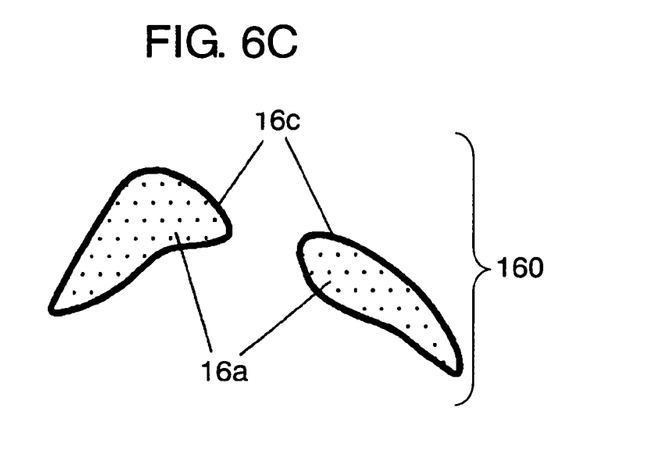

FIG. 1 is a front view of an electronic component mounting apparatus adapted for a soldering method according to the first exemplary embodiment of the present invention, FIG. 2A and FIG. 2B are explanatory drawings showing the soldering method according to the first exemplary embodiment of this invention, FIG. 3A and FIG. 3B are explanatory drawings also showing the same soldering method, FIG. 4 is an explanatory drawing showing a flux transferring process in the same soldering method, FIG. 5 is an explanatory drawing showing a solder bonding process in the same soldering method, and FIG. 6A, FIG. 6B and FIG. 6C are sectioned views of metal powder to be mixed with flux in the same soldering method.

Referring to FIG. 1, description is provided first of a structure of the electronic component mounting apparatus adapted for the soldering method according to the first exemplary embodiment of this invention. This electronic component mounting apparatus has a function of mounting an electronic component having solder bumps to a substrate. The apparatus has a structure comprising component feeder unit 1, flux transfer unit 2 and substrate retainer unit 3 disposed serially, and component transferring mechanism 4 arranged above these units.

Component feeder unit 1 is provided with component tray 5. Component tray 5 carries a plurality of electronic components 6, each having solder bumps 7, or protruding electrodes (hereinafter simply referred to as "bump 7") formed on an underside surface thereof. Bumps 7 are formed of fine particulate solder balls which are bonded with solder to electrodes for external connections of electronic component 6. Sizes of bumps 7 as they are formed, are not uniform for such reasons as variation in dimension of the solder balls, and therefore the individual bumps 7 vary in height to their bottom ends. Here, bumps 7 are in the condition of being oxidized throughout their surfaces since they are exposed to the air (refer to oxide films 7a shown in FIG. 2A, FIG. 2B, FIG. 3A and FIG. 3B).

Flux transfer unit 2 arranged adjacent to component feeder unit 1 is provided with transferring stage 8 having a smooth plane defining transferring surface 8a. Also provided is squeegee 9 arranged above transferring surface 8a in a manner that it is horizontally movable along transferring surface 8a by a squeegee moving mechanism (not shown in the figure). While flux 10 is supplied to transferring surface 8a, a thin-film forming process is carried out by moving squeegee 9 in a direction parallel to transferring stage 8 to spread flux 10 into a membranous form on transferring surface 8a and to form thin flux film 10a.

Description is provided now of a composition of flux 10. In FIG. 2A, flux 10 is a compound of an activator and metal powder 16 mixed as additives into a liquid base of high viscosity made of a resin material such as rosin dissolved in a solvent. The activator is added for the purpose of removing oxide films 7a formed on the surfaces of bumps 7, and an organic acid and the like substance are normally used for their ability to remove such oxide films. A substance of low activity is useful as the activator in this embodiment here, to avoid the need for cleansing after the soldering.

It is desirable that a material used for metal powder 16 has such properties as a melting point higher than that of the solder used for bumps 7, that it does not produce oxide films on the surfaces of metal powder 16 in the air ambient, and has good wettability to the solder composing bumps 7 so as to allow the melted bumps 7 in a fluid state of the solder to flow and spread easily over the surfaces of metal powder 16.

More specifically, metal powder 16 is made to contain at least one of gold, silver and palladium, each having a purity of 90% or higher. In other words, metal powder 16 contains a single element of gold, silver or palladium of 90% or higher purity. Alternatively, metal powder 16 may contain any combination of two elements among gold, silver and palladium, each having 90% or higher purity. Or, metal powder 16 may contain all three elements of gold, silver and palladium, each having 90% or higher purity.

The metals are processed to form scaly (flaky) fragments of metallic foil and mixed into the base of flux 10. It is desirable here that sizes of the majority of metal powder 16 are within a range of 0.05 µm and 20 µm, and a mixing ratio is in a range of 1% to 20% by volume of the base.

Flux 10 is transferred to the bottom portions of bumps 7, as bumps 7 are pressed against transferring surface 8a covered with thin flux film 10a containing metal powder 16, as shown in FIG. 2B. At the same time, vertical compression mechanism 14 shown in FIG. 1 having its compressing force adjusted properly carries out a flattening process to make the plurality of bumps 7 of uniform height by partially crushing the bottom portions of bumps 7 with the compressing force. Solid fragments of metal powder 16 hence bite partially into oxide films 7a covering the surfaces of bumps 7 by the compressing force in the flattening process, and embed into the solder material of bumps 7.

In this embodiment here, transferring surface 8a on transferring stage 8 is not a perfect smooth plane but it is formed with a predetermined roughness having tiny asperities 8b throughout the surface as shown in FIG. 4 which depicts a microscopic view of part "A" shown in FIG. 2B. In the compression process of bumps 7, fragments of metal powder 16 are pressed against bumps 7 by means of asperities 8b. Accordingly, these asperities 8b help embed the flaky fragments of metal powder 16 into bumps 7, of which oxide films 7a are not otherwise easy to penetrate through. The presence of metal powder 16 thus having penetrated oxide films 7a and embedded in the bottom parts of bumps 7 can improve the bonding quality in the reflow soldering for bonding melted bumps 7 to electrodes 12a on substrate 12.

In the above structure, flux transfer unit 2 is provided with transferring stage 8 having transferring surface 8a of the smooth plane, and squeegee 9, so that they constitute a thin-film forming mechanism for spreading flux 10 containing metal powder 16 into a membranous form on the smooth plane by moving squeegee 9 in the direction parallel to the smooth plane. In addition, component transferring mechanism 4 provided with vertical compression mechanism 14 constitutes a pressurizing mechanism for pressing bumps 7 against a portion of transferring surface 8a whereon thin flux film 10a is formed and making metal powder 16 into embedment in the surfaces of bumps 7.

In FIG. 1, substrate retainer unit 3 disposed adjacent to flux transfer unit 2 is provided with substrate retaining table 11. Substrate retaining table 11 holds thereon substrate 12 having electrodes 12a formed on its upper surface. Component transferring mechanism 4 has vertical compression mechanism 14 which is movable in the horizontal direction along motion table 13. Vertical compression mechanism 14 is provided with component retaining head 15 mounted to its lower end, and this component retaining head 15 has a function of retaining electronic component 6 by sucking it to the bottom face. While component retaining head 15 is positioned above component feeder unit 1, vertical compression mechanism 14 is driven to move component retaining head 15 vertically toward component tray 5 for sucking and picking up electronic component 6.

Subsequently, component retaining head 15 holding electronic component 6 is moved to a position of flux transfer unit 2, and vertical compression mechanism 14 is driven to move component retaining head 15 downward to thin flux film 10a formed on transferring surface 8a, and press bumps 7 against transferring surface 8a. This motion transfers flux 10 to the bottom portions of bumps 7, and causes metal powder 16 to bite into bumps 7. The bottom portions of bumps 7 are also crushed at the same time for flattening by the compressing force, by which the plurality of bumps 7 are made uniform in height.

After the flux is transferred, component retaining head 15 holding electronic component 6 is moved to a position above substrate retainer unit 3, and moved vertically toward substrate 12 to mount electronic component 6 on substrate 12 with bumps 7 in alignment with electrodes 12a on substrate 12. Component transferring mechanism 4 hence functions as a mounting mechanism for mounting electronic component 6 after positioning the bumps embedded with metal powder 16 in alignment to electrodes 12a on substrate 12. Component transferring mechanism 4 also functions as the previously mentioned compression mechanism at the same time.

Next, description is provided in more detail of a soldering method for soldering electronic component 6 provided with bumps 7 to substrate 12 with reference to FIG. 2A through FIG. 5. In this soldering method, bumps 7 are melted and soldered to electrodes 12a of substrate 12 by subjecting electronic component 6 mounted on substrate 12 to the reflow process after the flux is transferred to bumps 7. Here, FIG. 4 and FIG. 5 depict microscopic views of part "A" shown in FIG. 2B and part "B" shown in FIG. 3B respectively.

In FIG. 2A, flux 10 containing metal powder 16 is spread into a membranous form over transferring stage 8 having smooth transferring surface 8a, to form thin flux film 10a (i.e., thin-film forming step). Following the above, component transferring head 15 holding electronic component 6 shown in FIG. 1 is moved above transferring stage 8, and bumps 7 are pressed upon the portion of transferring surface 8a where thin flux film 10a is formed, to make fragments of metal powder 16 embed in the surfaces of bumps 7 (i.e., metal powder embedding step).

In the metal powder embedding step, asperities 8b formed on transferring surface 8a are used to help make the flaky fragments of metal powder 16 penetrate oxide films 7a and embed into bumps 7, as shown in the detailed view of part "A" in FIG. 4. Transferring surface 8a needs not be provided with asperities 8b, however, if metal powder 16 has such a shape as spherical grain that can penetrate easily through oxide films 7a.

After that, component retaining head 15 shown in FIG. 1 is raised from transferring stage 8 to complete the flattening process, in which the bottom parts of bumps 7 are crushed partially, and flux 10 is transferred to bumps 7 at the same time, as shown in FIG. 3A. Here, bumps 7 bear the embedded fragments of metal powder 16 on their bottom parts, so that these fragments as well as other fragments of metal powder 16 in the transferred flux 10 are brought to electrodes 12a together with bumps 7 in the mounting step described next.

After the flux is transferred and spread, electronic component 6 is mounted on substrate 12. First, electronic component 6 is mounted while bumps 7 bearing the embedded metal powder 16 are positioned in line with electrodes 12a on substrate 12, as shown in FIG. 3B (i.e., mounting step). After the mounting, substrate 12 is heated in a reflow furnace to melt bumps 7 and spread the melted solder over the surfaces of metal powder 16 embedded in bumps 7 and transferred to electrodes 12a (i.e., solder melting step).

Referring to the detailed view of part "B" in FIG. 5, description is provided further of this solder melting step. FIG. 5 depicts a section around an interface between surfaces of electrode 12a and bump 7 immediately prior to the start of solder bonding. Since bumps 7 are flattened in the flux transferring step, the bottom parts of all bumps 7 are in contact generally uniformly with the surfaces of electrodes 12a.

There is a case that oxide films 7a remain on the surfaces of bumps 7 without having been removed completely when flux 10 has a small degree of activating effect. If this is the case, solder bumps 7 are not in contact directly with the surfaces of electrodes 12a, but only through oxide films 7a on the surfaces. On the other hand, the fragments of metal powder 16 penetrating oxide films 7a and embedding in the bottom parts of bumps 7 are in contact with the surfaces of electrodes 12a directly, or through the other fragments of metal powder 16 contained in flux 10. Or, even if the embedding fragments of metal powder 16 are not in contact with electrodes 12a, they are closely adjoining the surfaces of electrodes 12a with a negligible clearance since the flattening provides bumps 7 with uniform contact to electrodes 12a.

When bumps 7 melt in this condition, melted solder flows and spreads downward along the surfaces of metal powder 16 in contact between bumps 7 and surfaces of electrodes 12a through oxide films 7a. The melted solder of bumps 7 reaches the surfaces of electrodes 12a directly or through surfaces of other fragments of metal powder 16 in the space between oxide films 7a and electrodes 12a, and it then spreads horizontally over the surfaces of electrodes 12a. The melted solder of bumps 7 thus comes to cover the entire bonding surface of electrodes 12a. The melted solder subsequently completes the solder bonding of bumps 7 to electrodes 12a when it cools and solidifies.

In this solder bonding process, the activator included in flux 10 is for providing an effect of removing oxide films 7a from bumps 7. However, the activator included here needs not be so active, since the method discussed above ensures solder bonding of good quality by allowing the melted solder to flow and spread through the fragments of metal powder 16 penetrating oxide films 7a even if oxide films 7a are not completely removed.

In other words, this method allows use of low-active flux having a small activating effect since metal powder 16 is used to penetrate oxide film 7a in advance. For this reason, there is only a small degree of corrosion, if any, in circuit electrodes due to the active ingredient, even when the flux remains after the solder bonding. The invention can hence provide solder bonding portions of high quality which do not result in bonding failure or promote deterioration of the insulating property even with the no-cleaning method in which cleansing process for removing flux is omitted after the soldering.

The metal powder mixed into flux 10 may be such a material as metal powder 160 shown in FIG. 6A, which comprises core metal 16a representing a nucleus, and surface metal 16b covering the exterior of core metal 16a, instead of using the material of a single metal element. In this powder structure, a metal material is selected among tin (Sn), zinc (Zn), lead (Pb) and indium (In) as the element used for core metal 16a, from which scaly (flaky) fragments of metallic foil are formed. The exterior surface of core metal 16a is then covered with a film of either gold (Au) or silver (Ag) having a good wettability to solder by such means as electroplating to form surface metal 16b.

A combination of metal elements used here for core metal 16a and surface metal 16b is so selected that it achieves such a diffusional characteristic that heating during the reflow process readily causes diffusion of surface metal 16b to the internal core metal 16a (shown by arrows in FIG. 6B), and nearly all the amount of surface metal 16b is taken inside core metal 16a and the diffusion of surface metal 16b comes to a completion at the end of the reflow process. That is, surface metal 16b in this composition is formed of a metal having a good wettability to solder, and core metal 16a formed of another metal having a property of solubilizing surface metal 16b and taking it inside with the heat of the reflow process.

By adopting metal powder 160 of such a composition as the material mixed into flux 10, the invention can provide advantageous effects as described hereinafter. First, when solder bumps 7 are melted in the solder melting step discussed above, surface metal 16b of metal powder 160 fulfills a role of allowing the melted solder in contact to its surface to wet and spread, and guiding the solder along the surface. Here, metal powder 160 is designed to use precious metals such as expensive gold and silver as surface metal 16b to cover the surface of core metal 16a made of an inexpensive material. Metal powder 160 therefore makes possible a substantial cost reduction as compared to the conventional method of using the expensive precious metal in a pure state as the metal powder mixed in the flux.

Surface metal 16b is gradually taken inside core metal 16a by diffusion, as shown by the arrows in FIG. 6B, when heating is continued in the solder melting step. There is an instance in which surface metal 16b diffuses into core metal 16a of a liquid phase, and another instance in which surface metal 16b diffuses into core metal 16a of a solid phase, depending on a kind of metal used for core metal 16a and the heating temperature. In either instance, however, surface metal 16b is taken gradually inside core metal 16a. When surface metal 16b has diffused completely thereby exposing the surface of core metal 16a, there forms oxide film 16c on the surface of metal powder 160 due to oxidation of core metal 16a by the heating, as shown in FIG. 6C. This oxide film 16c provides the following advantage of improving the insulating property after the solder bonding.

In the no-cleaning method in which cleansing process for removing flux is omitted after the solder bonding step, the metal powder contained in the solder paste remains intact as flux residue around the solder bonding portions. When such metals as gold and silver are used in a pure state as the metal powder, as has been done in the conventional manner, there is a risk of progressing migration, depending on the residual amount, which produces electrical corrosion between circuit electrodes of the substrate and degrades the insulating property. It was therefore necessary in the past that a mixing ratio of the metal powder is kept low in consideration of maintaining the insulating property. As a result, there was a possibility that the metal powder does not achieve the effect of spreading melted solder satisfactorily.

According to this exemplary embodiment of the invention, on the other hand, use of metal powder 160 of the above composition prevents the risk of migration and ensures good insulating property, since the surface of metal powder 160 is covered with stable oxide film 16c even if a considerable amount of metal powder 160 remains in the vicinity of the solder bonding portions after the solder bonding step. Accordingly, the use of metal powder 160 of the above composition makes possible to mix a sufficient amount of the metal powder into the solder paste to improve quality of the solder bonding as well as reliability of mounting by virtue of the insulating property after the solder bonding.

Second Exemplary Embodiment

Figure 7:
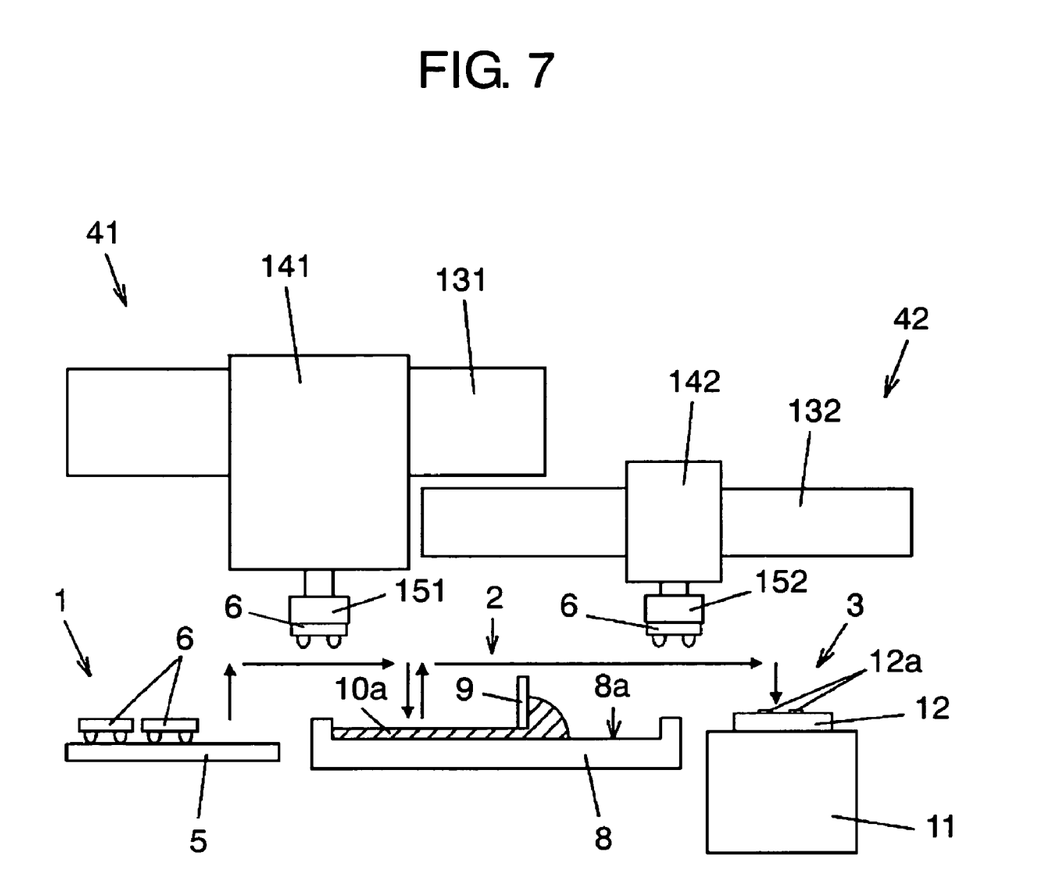
FIG. 7 is a front view of an electronic component mounting apparatus adapted for a soldering method according to a second exemplary embodiment of this invention.

FIG. 7 is a front view of an electronic component mounting apparatus adapted for a soldering method according to the second exemplary embodiment of the present invention. The apparatus of this second exemplary embodiment is so constructed that a flux transferring operation for electronic component 6 and a mounting operation of electronic component 6 to substrate 12 are executed by separate component transferring mechanisms prepared exclusively, instead of the single unit of component transferring mechanism 4 used in the first exemplary embodiment.

In FIG. 7, component feeder unit 1, flux transfer unit 2 and substrate retainer unit 3 are analogous to the corresponding units of the first exemplary embodiment shown in FIG. 1. In this second exemplary embodiment, however, there are first component transferring mechanism 41 disposed above component feeder unit 1 and flux transfer unit 2, and second component transferring mechanism 42 disposed above flux transfer unit 2 and substrate retainer unit 3.

First component transferring mechanism 41 has first vertical compression mechanism 141 which is movable in the horizontal direction along first motion table 131. Second component transferring mechanism 42 has second vertical compression mechanism 142 which is also movable in the horizontal direction along second motion table 132.

First vertical compression mechanism 141 is provided with first component retaining head 151 mounted to its lower end, and this component retaining head 151 has a function of retaining electronic component 6 by sucking it to the bottom face. Second vertical compression mechanism 142 is provided with second component retaining head 152 mounted to its lower end, and this component retaining head 152 also has the function of retaining electronic component 6 by sucking it to the bottom face.

While first component retaining head 151 is positioned above component feeder unit 1, first vertical compression mechanism 141 is driven to move first component retaining head 151 vertically toward component tray 5 for sucking and picking up electronic component 6. Subsequently, first component retaining head 151 holding electronic component 6 is moved to a position of flux transfer unit 2, and first vertical compression mechanism 141 is driven to move first component retaining head 151 downward to thin flux film 10a formed on transferring surface 8a.

This motion transfers flux to bumps, causes metal powder to bite into the bumps, and flattens the bumps in the same manner as the apparatus of the first exemplary embodiment. In other words, first component transferring mechanism 41 constitutes a pressurizing mechanism for pressing the bumps upon a portion of transferring surface 8a whereon thin flux film 10a is formed and making metal powder into embedment in the surfaces of the bumps.

Second component retaining head 152 holds electronic component 6 to which the flux is transferred, and moves to a position above substrate retainer unit 3. Second vertical compression mechanism 142 is driven here to vertically move electronic component 6 toward substrate 12 and mount electronic component 6 on substrate 12. Second component transferring mechanism 42 hence functions as a mounting mechanism for mounting electronic component 6 after positioning the bumps embedded with the metal powder in alignment to electrodes 12a on substrate 12.

As described, the apparatus is provided with first component transferring mechanism 41 having the function of embedding the metal powder in the bumps by pressing them against transferring surface 8a, and second component transferring mechanism 42 having the function of mounting electronic component 6 to substrate 12 after the flux is transferred, which are independent with each other, and thereby these mechanisms can be provided with proper operating characteristics according to the functions required for them individually.

In other words, first vertical compression mechanism 141 and first component retaining head 151 are provided with heavy-duty structure with capability of handling the work on large-size components with large number of bumps, which require a good amount of compressing force to make the metal powder embed into the bumps and to execute the flattening process properly. On the other hand, second vertical compression mechanism 142 and second component retaining head 152 are provided with a structure of high accuracy with good adaptability for handling certain kinds of substrates such as thin flexible substrates, which require a high locating accuracy and a precise loading control in the mounting operation.

INDUSTRIAL APPLICABILITY

The present invention is very useful as a soldering method to be adapted to an electronic component mounting apparatus for soldering electronic components formed with solder bumps to a substrate, and the invented method can provide solder bonding portions of high quality without resulting in any soldering defect and deterioration of the insulating property.

Reference numerals in the drawings
2 Flux transfer unit
4 Component transferring mechanism
6 Electronic component
7 Solder bump
7a Oxide film
8 Transferring stage
8a Transferring surface
8b Asperities
9 Squeegee
10 Flux
10a Thin flux film
12 Substrate
12a Electrode
13 Motion table
14 Vertical compression mechanism
15 Component retaining head
16, 160 Metal powder
16a Core metal
16b Surface metal
16c Oxide film
41 First component transferring mechanism
42 Second component transferring mechanism
131 First motion table
132 Second motion table
141 First vertical compression mechanism
142 Second vertical compression mechanism
151 First component retaining head
152 Second component retaining head

The invention claimed is:

1. A method of soldering an electronic component to an electrode on a substrate, the method comprising the steps of:
providing an electronic component which includes a solder bump and an oxide film provided on the solder bump;
spreading flux containing metal powder into a membranous form on a stage having a transferring plane having an asperity, the metal powder containing a flaky form of metallic foil, the metal powder having a melting point higher than a melting point of the solder bump;
pressing the solder bump against a portion of the transferring plane covered with the flux of the membranous form;
said asperity having a geometry configured to embed the metal powder in a surface of the solder bump through the oxide film;
disposing the solder bump embedded with the metal powder on the substrate with the bump in alignment to the electrode; and
heating the substrate to melt the solder bump and leading the melted solder to the electrode on the substrate by flowing and spreading the melted solder along a surface of the metal powder.

2. The method of soldering according to claim 1, wherein the metal powder contains at least one of gold, silver and palladium, each having a purity of 90% or higher.

3. The method of soldering according to claim 1, wherein the metal powder includes a core metal and a surface metal covering an exterior of the core metal.

4. The method of soldering according to claim 3, wherein the surface metal comprises a metal of a good wettability to solder, and the core metal comprises a metal with a property of solubilizing and taking therein the surface metal when heated.

5. The method of soldering according to claim 3, wherein the surface metal contains one of gold and silver, and the core metal contains any one of tin, zinc, lead and indium.

6. The method of soldering according to claim 4, wherein the surface metal contains one of gold and silver, and the core metal contains any one of tin, zinc, lead and indium.

7. The method of soldering according to claim 1, wherein the transferring plane has a predetermined roughness.

* * * * *